(12) United States Patent
Arami et al.

(10) Patent No.: US 11,088,012 B2
(45) Date of Patent: Aug. 10, 2021

(54) WAFER SUSCEPTOR APPARATUS WITH THERMAL INSULATION AND METHOD FOR MANUFACTURING THE SAME

(71) Applicant: PIOTECH INC., Shenyang (CN)

(72) Inventors: Junichi Arami, Shenyang (CN); Ren Zhou, Shenyang (CN)

(73) Assignee: PIOTECH INC., Shenyang (CN)

( * ) Notice: Subject to any disclaimer, the term of this patent is extended or adjusted under 35 U.S.C. 154(b) by 286 days.

(21) Appl. No.: 16/376,205

(22) Filed: Apr. 5, 2019

(65) Prior Publication Data

US 2020/0161166 A1 May 21, 2020

(30) Foreign Application Priority Data

Nov. 19, 2018 (CN) .......................... 201811372713.5

(51) Int. Cl.
*H01L 21/687* (2006.01)
*H01L 21/67* (2006.01)

(52) U.S. Cl.
CPC .. *H01L 21/68742* (2013.01); *H01L 21/67103* (2013.01)

(58) Field of Classification Search
CPC ................................................ H01L 21/68742
See application file for complete search history.

(56) References Cited

U.S. PATENT DOCUMENTS

| | | | | |
|---|---|---|---|---|
| 5,207,437 A | * | 5/1993 | Barnes | B23Q 3/15 269/8 |
| 9,340,462 B2 | * | 5/2016 | Harris | H01L 21/67248 |
| 2003/0159307 A1 | * | 8/2003 | Sago | H01L 21/67017 34/107 |
| 2009/0041568 A1 | * | 2/2009 | Muraoka | H01L 21/67103 414/586 |
| 2014/0202386 A1 | * | 7/2014 | Taga | C23C 4/08 118/723 R |
| 2014/0334060 A1 | * | 11/2014 | Parkhe | H01L 21/6831 361/234 |
| 2017/0040191 A1 | * | 2/2017 | Benjaminson | H01J 37/32082 |
| 2017/0051406 A1 | * | 2/2017 | Mori | C23C 16/45544 |

FOREIGN PATENT DOCUMENTS

CN 101807515 A 8/2010

* cited by examiner

*Primary Examiner* — Nathaniel Herzfeld
(74) *Attorney, Agent, or Firm* — Locke Lord LLP; Tim Tingkang Xia, Esq.

(57) ABSTRACT

A plate for supporting wafer has a top for carrying a wafer and a bottom coupled to a pedestal. The plate includes multiple heating units embedded within the plate and at least one set of grooves formed between the top and the bottom of the plate at a radial location between two of neighboring heating units to thereby enhance heat insulation among the heating units.

7 Claims, 4 Drawing Sheets

WAFER SUSCEPTOR APPARATUS WITH THERMAL INSULATION AND METHOD FOR MANUFACTURING THE SAME

CROSS-REFERENCE TO RELATED APPLICATIONS

This non-provisional application claims priority under 35 U.S.C. § 119(a) on Patent Application No(s). No(s). 201811372713.5 filed in China on Nov. 19, 2018, the entire contents of which are hereby incorporated by reference.

BACKGROUND

Technical Field

The present disclosure relates to a wafer susceptor apparatus and a method for manufacturing the same, and more particularly, to a wafer susceptor apparatus with improved thermal insulation and a method for manufacturing the same.

Description of Related Art

Conventionally, a wafer susceptor apparatus in a reaction chamber of semiconductor processing equipment is used for supporting a wafer in order to facilitate various processes taking place within the chamber, such as etching. Typically, it is essential to control the temperature of the wafer during wafer fabrication. As such, wafer susceptor apparatuses are designed as heating apparatuses that contain a temperature control mechanism enabling precise control over the temperature of the wafer in various processing applications. A typical wafer heating apparatus comprises a ceramic or metal plate as well as heating units embedded within the plate, such as heating coils. More specifically, a wafer boat can further comprise a temperature sensor, a controller and other electronic units.

Heating apparatuses play an important role in various wafer fabrication processes, such as chemical vapor deposition (CVD), plasma-enhanced chemical vapor deposition (PEVCD), photolithography, etching and cleaning, because temperature control is an essential step for regulating chemical reactions. As reagent gases may form a conductive film or an insulation layer on the wafer surface through chemical reactions with the substances thereon, heat control becomes a key factor for achieving on the entire wafer a high-quality film with an even thickness.

China Patent Application No. CN101807515A discloses a heating apparatus having multi-zone heating functions and comprising a plate that has multiple resistance heating units. Each heating unit is configured to produce heat within a specified range, and the shape of each heating unit corresponds to a heating zone on the plate surface. The surface temperature may be evenly distributed by controlling the line width of each heating unit and the power provided thereto. Given that heat flow rate varies according to the temperature gradient, the direction of heat flow within the plate, particularly the horizontal direction, may be uncontrollable when heat is provided at various degrees using multiple heating units. This may affect the time required for heating the pedestal and the resulting temperature distribution thereon.

Therefore, there remains a need for a wafer susceptor apparatus with improved thermal insulation to achieve control of said wafer temperature.

SUMMARY OF INVENTION

One objective of the invention is to provide a wafer susceptor having a plate with a top for carrying the wafer and a pedestal coupled to a bottom of the plate. The plate includes plural heating units embedded between the top and bottom of the plate, the heating units are respectively positioned at different radial regions of the plate to define plural heating zones of the plate; and at least one set of trenches formed on a radial position between the top and bottom of the plate, and between two of neighboring heating units to enhance thermal insulation for the heating zones.

In some embodiments, the at least one set of trenches includes at least one trench extending inward from the bottom of the plate.

In some embodiments, the at least one set of trenches includes a trench sealed in the plate and extending between the top and bottom of the plate.

In some embodiments, the at least one set of trenches includes a first trench and a pair of second trenches, the first trench is sealed in the plate and extends between the top and bottom of the plate, the pair of second trenches extend inward from the bottom of the plate, and the first trench is sandwiched by the pair of second trenches.

In some embodiments, the plate further comprising: an electrode distributed between the top and the at least one set of trenches of the plate.

Another objective of the invention is to provide a method for manufacturing a wafer susceptor. The method includes preparing plural layers; performing a stamping process to a part of the layers to form at least one slit pattern on each of the part of the layers; performing a metallization process to form at least one metal pattern onto each of the part of the layers; and performing a stacking process to stack the layers in a predetermined order to form a plate of the wafer susceptor, wherein the slit patterns of the part of layers correspond to each other to thereby form at least one set of trenches in the plate.

In some embodiments, the at least one slit patter is an arc-shaped pattern defined by a slit.

In some embodiments, in the stamping process, each of a first part of the layers has three slit patterns formed thereon, and each of a second part of the layers has two slit patterns formed thereon.

BRIEF DESCRIPTION OF THE DRAWINGS

The above-mentioned and other features and advantages of the disclosure can be better understood with reference to the following detailed description and drawings.

DETAILED DESCRIPTION

Various exemplary embodiments will be described in detail with reference to the accompanying drawings that form a part of the present disclosure. Also, these embodiments are described with examples that could be carried out to achieve said embodiments, wherein sufficient details are provided to allow a person ordinarily skilled in the art to achieve said embodiments. It will be appreciated that, without departing from the spirit and scope of said embodiments, other embodiments could be used and other changes could be made. In addition, despite the foregoing, appearances of the phrase "in one embodiment" are not necessarily referring to the same or one single embodiment. Therefore, the following detailed description is not to be taken in a limiting sense, and the scope of said embodiments is defined by the appended claims alone.

Unless otherwise specified in the entire description and the appended claims, each of the following terms carries the meaning specifically defined below. As used herein, unless otherwise specified, the term "or" is to be taken in an inclusive sense, and is equivalent to the term "and/or." Unless otherwise specified herein, the term "according to" is not to be taken in an exclusive sense, and allows references to be made to many other factors not described herein. Additionally, in the entire description, the terms "a," "one" and "the" are also used in the plural sense. The term "in" is used herein to mean both "in" and "on."

A summary of the subject matters covered in the present disclosure will be given below to provide basic knowledge of some aspects thereof. It shall not be expected that the summary serves as a complete description of the subject matters, or is used for identifying main or key units, or illustrating or limiting the scope of the subject matters. Instead, the sole purpose of this summary is to briefly demonstrate certain concepts as a prelude to a more detailed description that follows.

Figure 1:
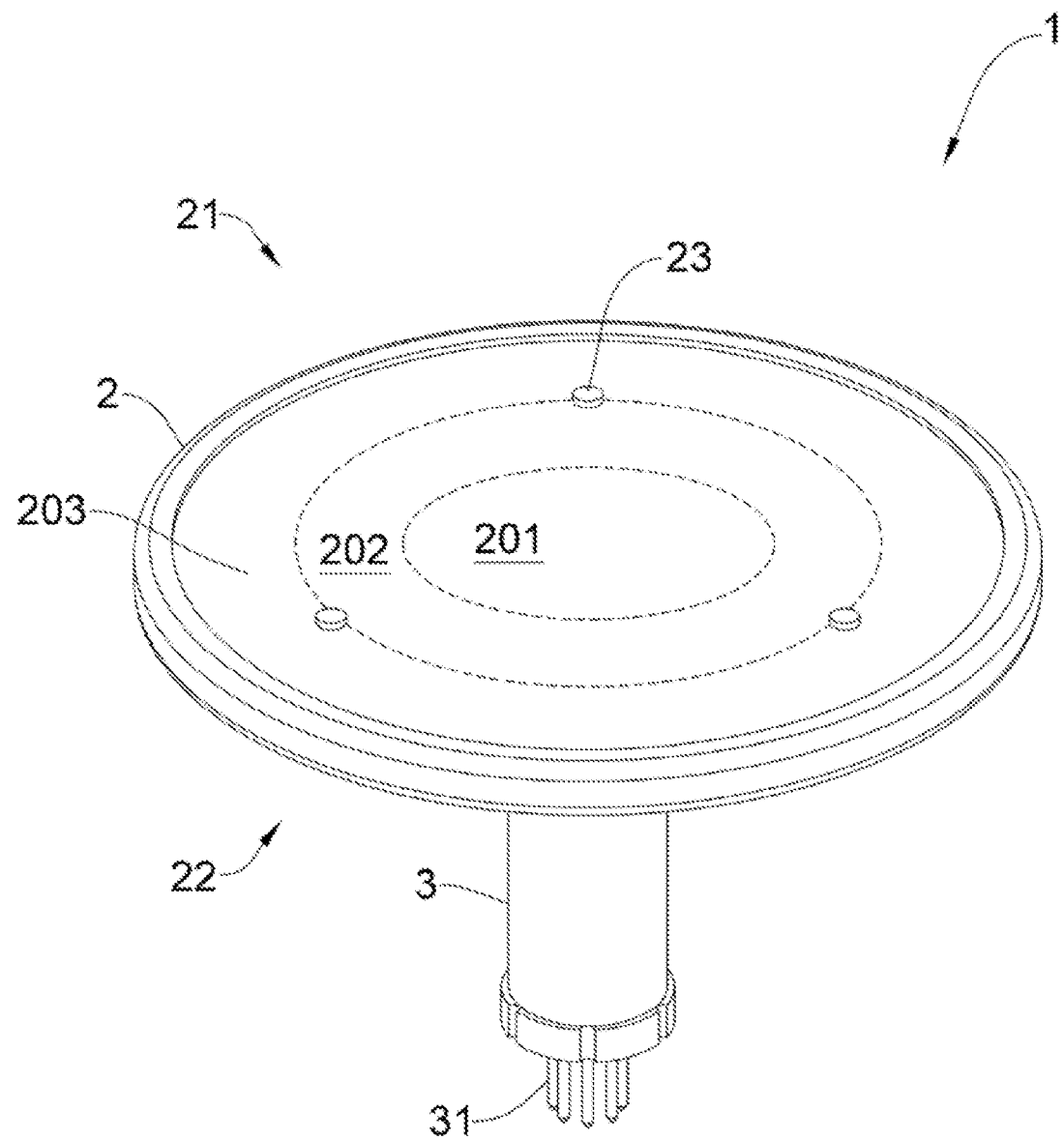
FIG. 1 is a perspective view showing the wafer susceptor apparatus according to the present disclosure.
Figure 2:
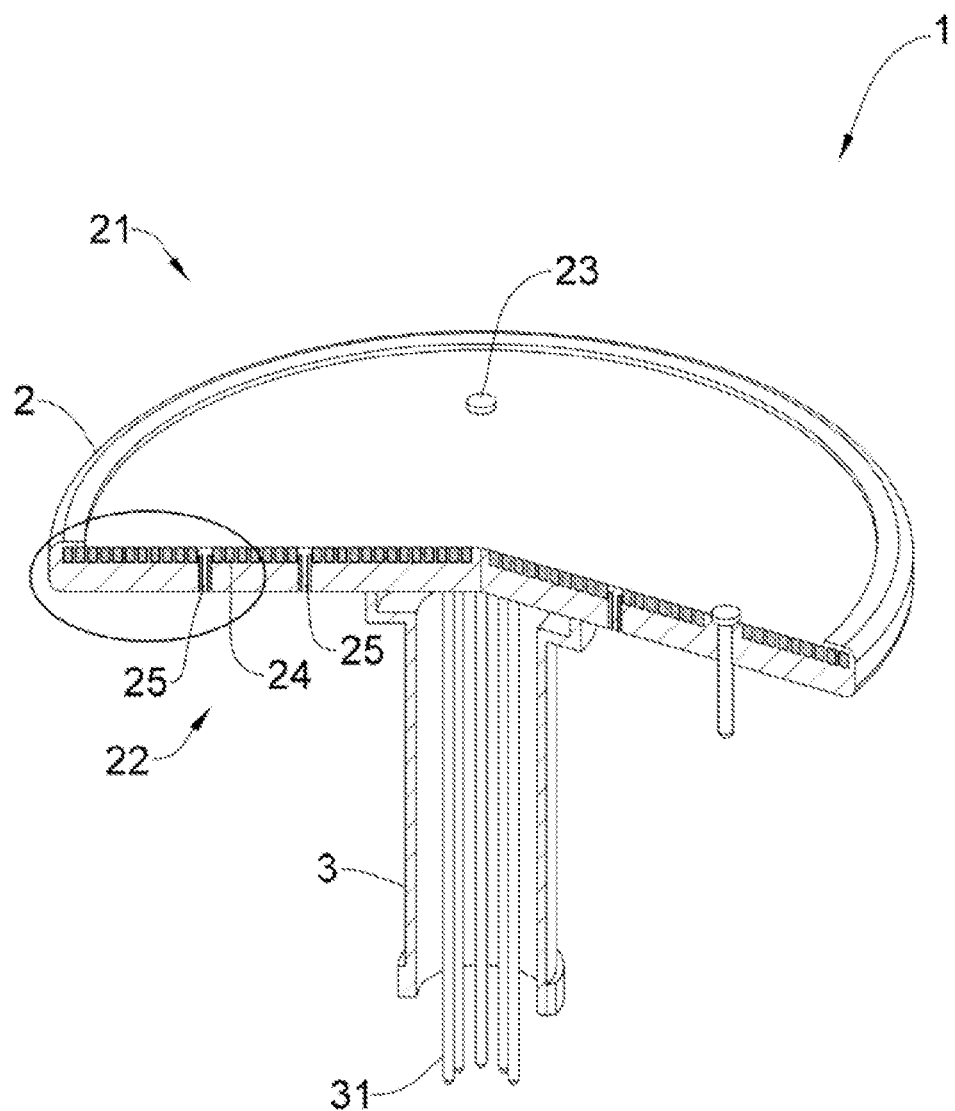
FIG. 2 is a cross-sectional view of FIG. 1.

FIG. 1 is a perspective view showing a wafer susceptor apparatus 1 according to the present disclosure. FIG. 2 is a longitudinal cross-sectional view of FIG. 1. The wafer susceptor apparatus 1 is used for supporting a wafer in a processing chamber (not shown) to carry out various processes (such as cleaning, etching or depositing), and includes a plate 2 and a pedestal 3. The plate 2 has a top 21 and a bottom 22, wherein the top 21 has a substantially flat support surface for carrying the wafer, the support surface further provides a plurality of pins 23 for lifting the wafer from the support surface, the bottom 22 is connected to one end of the pedestal 3, and another end of the pedestal 3 extends toward the bottom of the processing chamber or even penetrates through the chamber.

The pedestal 3 is basically a cylinder that guides a plurality of wires to be connected to various electronic units of the plate 2, such as heating units 24, temperature sensing units (not shown) for sensing the plate surface and a bottom electrode (not shown) used for plasma processing. As such, said wires may include power wires used mainly for providing electric power, signal wires used mainly for receiving sensed signals, and a grounding wire connected to an electric potential or grounded. Said heating units 24, temperature sensing units and electrode are basically embedded within the plate 2 and spaced properly from each other, wherein the heating units 24 are formed basically by patterned coils.

FIG. 1 shows that the support surface of the plate 2 is divided into a first heating zone 201, a second heating zone 202 and a third heating zone 203 along a radial direction. These heating zones are determined by the distribution of each of the heating units 24 of the plate 2. Accordingly, these heating zones provide heat to corresponding zones on the wafer. These heating units 24 include a first heating unit, a second heating unit and a third heating unit independent from each other, each heating unit having its own temperature sensing unit by which the heating zones are able to individually sensing and control the temperature of the wafer. It will be appreciated by a person ordinarily skilled in the art that other arrangements of heating zones are possible apart from those described in the exemplary examples.

FIG. 2 shows that a plurality of sets of trenches 25 are formed at different radial locations on the plate 2, and each set of trenches 25 is distributed between two neighboring heating units 24, thereby enhancing horizontal thermal insulation among the heating units/zones. Each set of trenches 25 extends within the space between two neighboring heating units 24; therefore, the sets of trenches 25 and the heating units 24 are concentric. The set of trenches 25 may extend discontinuously when it, for example, comes into contact with other structures, such as a pin 23 or wiring (not shown), along the direction in which it extends.

Figure 3:
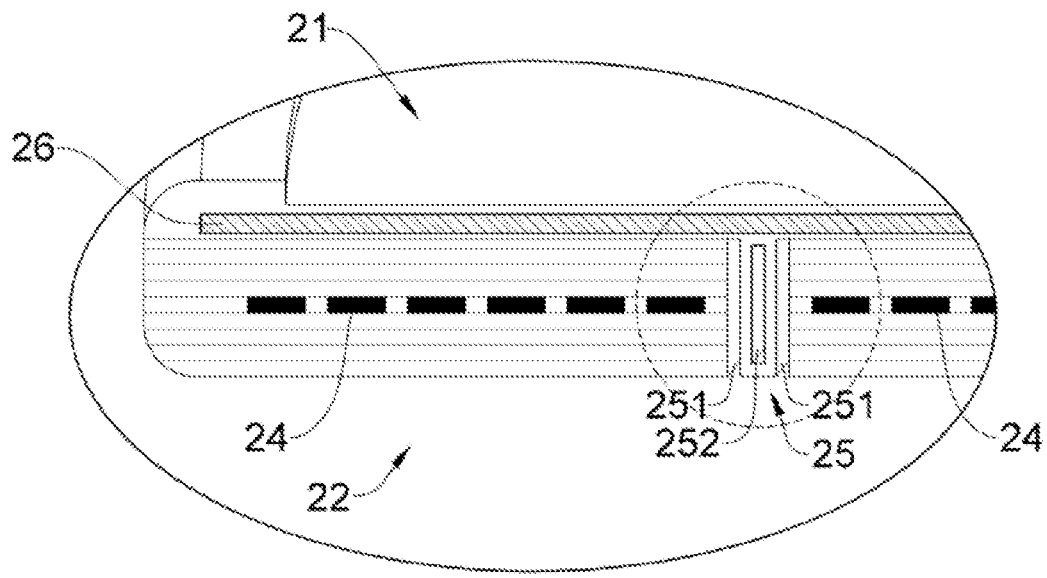
FIG. 3 is part of the cross-sectional view showing the wafer susceptor apparatus according to the present disclosure.

FIG. 3 is part of the cross-sectional view of the plate 2, showing details of the set of trenches 25 in a clear manner. The set of trenches 25 has at least one trench being formed between the top 21 and the bottom 22 of the plate 2, as well as disposed between two neighboring heating units 24. Additionally, an electrode 26 is positioned between the support surface and the set of trenches 25 and serves as a bottom electrode for plasma processing. As shown in FIG. 3, the set of trenches 25 consists of three trenches, including a first trench 252 and a pair of second trenches 251. The first trench 252 is embedded within the plate 2, the second trenches 251 extend a depth inward from the bottom 22 of the plate 2, and the first trench 252 is disposed between the pair of second trenches 251. The first trench 252 and the second trenches 251 separate two neighboring heating units 24 at least by a distance, so that the horizontal path for heat transfer therebetween increases and the speed of such heat transfer may be reduced by the air gap in the trenches. Furthermore, barely no air is left in the second trenches 251 when the processing chamber has been pumped down, thereby reducing significantly the amount of heat being transferred horizontally. As a result, the temperature of said heating zones can be controlled in a more precise manner. In other embodiments, more or less first trench or second trenches or a combination thereof may be used. For example, a set of trenches may be a combination of one or more the kind of first trenches, or one or more the kind of second trenches. Without intending to limit the invention, the width of said grooves is less than 10 mm.

Figure 4:
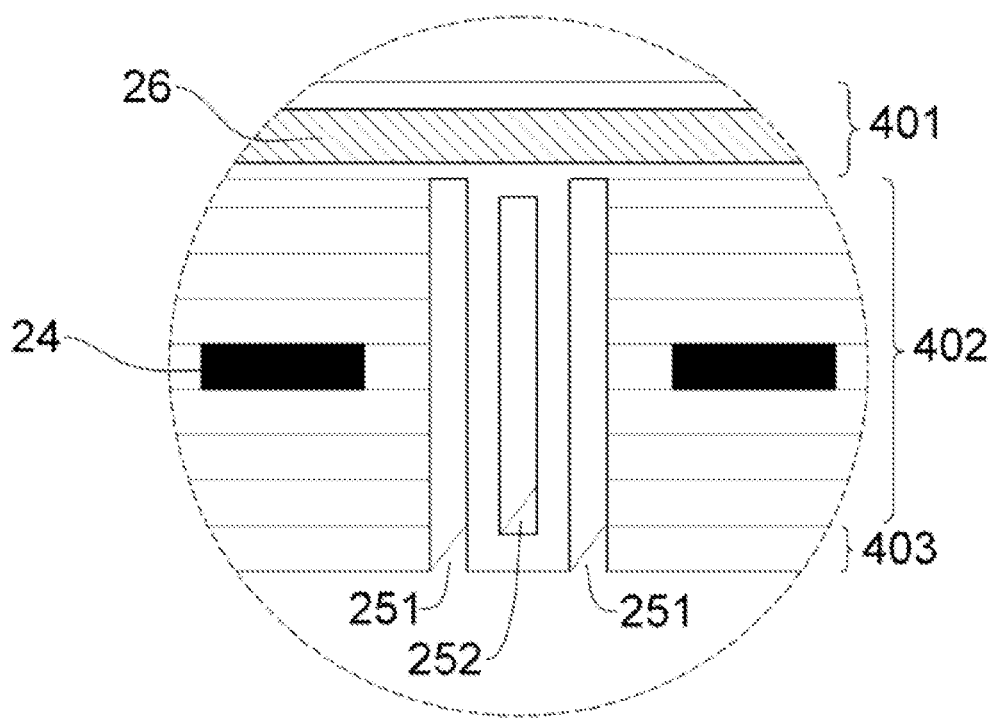
FIG. 4 is a schematic view showing a layered structure of the plate of the wafer susceptor apparatus according to the present disclosure.
Figure 5:
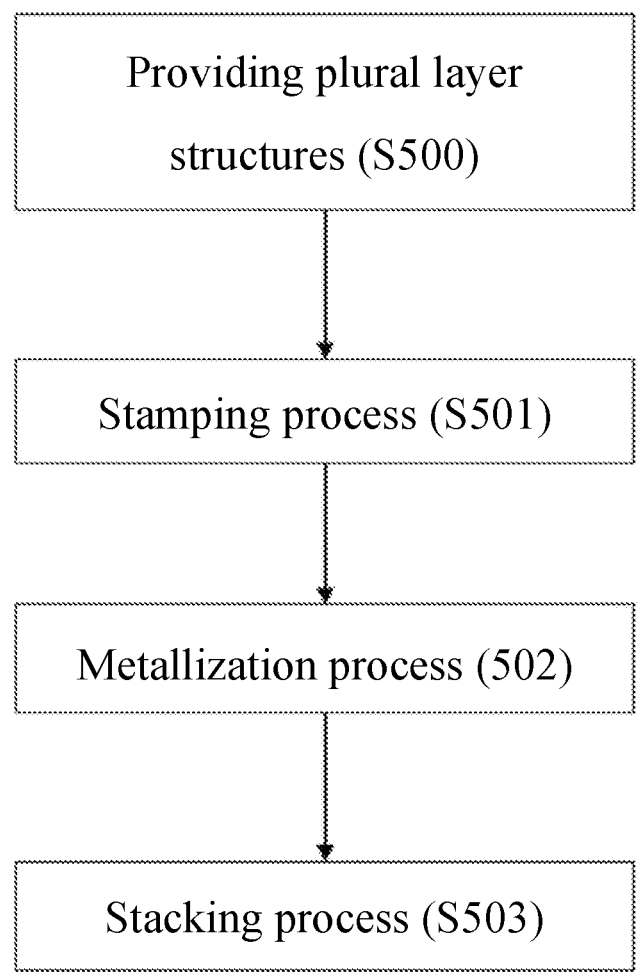
FIG. 5 is a flow chart showing the manufacture of the wafer susceptor apparatus according to the present disclosure.

The wafer susceptor apparatus of the present disclosure is manufactured using a multi-layer ceramic technique. FIG. 4 is a schematic view showing a layered structure of the plate 2. FIG. 5 is a block diagram showing the manufacturing flow chart of the plate 2, including step S500 to step S503.

At step S500, a plurality of layered structures are prepared and provided. First, a slurry is prepared using a known method, which includes mixing ceramic and glass powder and a minimal amount of a solvent and binding agent into a slurry. Casting is then carried out to mold the slurry into a plurality of layered structures of identical scale and dimension, so-called raw sheets or green sheets. Step S500 is completed at this point.

At step S501, stamping is performed on these layered structures, which includes cutting part of the layered structures into a shape of a circular plate, and forming multiple through-holes and grooves and at least one slit pattern, so that a part of layered structures have identical through-holes and slit patterns. For example, the trenches in FIG. 2 may have arc-shaped slit patterns. Step S501 is completed at this point.

At step S502, metallization treatment is performed on these layered structures, which includes forming vias in said through-holes and forming wires in said grooves, thereby forming vertical and horizontal conductive paths within the layered structures. For example, copper may be filled into the grooves to form vias and wires, and tungsten may be filled to form one or more coils used in aforementioned heating units. Said metallization treatment may be performed by electroplating, printing and/or depositing. Additionally, slits in slit patterns are kept. As such, each of the layered structures may have different or similar metal distribution. Step S502 is completed at this point.

At step S503, stacking is performed on the layered structures, which includes stacking the layered structures in an order which aligns the slit patterns of the layered structures. The stacked layered structures form the plate of the wafer susceptor apparatus. As shown in FIG. 4, the plate is formed by stacking a plurality of layered structures, including top layered structures 401, middle layered structures 402 and bottom layered structures 403. The top layered structures 401 contain relatively intact layers, having at most through-holes for pins. The top layered structures 401 may include said electrode layer 26. The slit patterns of the middle layered structures 402 are stacked to form three trenches that extend vertically, such as said first trench 252 and second trenches 251. One or more of the middle layered structures 402 include a number of said heating units 24, which are separated by said trenches by a distance. The bottom layered structures 403 have two aligned slit patterns and seal one of the trenches of the middle layered structures 402 after the stacking, thereby forming an embedded trench 252 and a pair of exposed trenches 251 with an opening facing downward. As a result, no air can flow between the embedded trench 252 and the chamber, while airflow can occur between a non-embedded trench 251 and the chamber. In this possible embodiment, known thermal insulation materials may be filled into said trenches, so that the structural strength and thermal insulating effects of the plate may be both maintained. Said stacking process includes hot pressing, thereby rendering the stacked objects solid. Finally, surface treatment may be further applied to the outermost layered structure to protect the plate 2 from chemical erosion. In addition, it is shown that the bottom layered structures 403 may also form a connecting structure connected to said pedestal 3, the connecting structure may include mechanical connectors and electrical connectors.

In summary, the wafer susceptor apparatus according to the present disclosure has a plate within which special sets of trenches are formed. The heating zones located at different areas within the plate can be controlled individually to provide a more even temperature distribution on the support surface of the wafer and to thereby facilitate reactions thereon. This satisfies the precision and evenness requirements of wafer reaction.

The above-mentioned details provide a thorough description regarding the manufacture and use of combinations of said embodiments. Various embodiments can be made without departing from the spirit and scope of such description. Thus, these embodiments will be included in the appended claims.

What is claimed is:

1. A wafer susceptor, having a plate with a top for carrying the wafer and a pedestal coupled to a bottom of the plate, characterized in that, the plate comprising:
    plural heating units embedded between the top and bottom of the plate, the heating units are respectively positioned at different radial regions of the plate to define plural heating zones of the plate; and
    at least one set of trenches formed on a radial position between the top and bottom of the plate, and between two of neighboring heating units to enhance thermal insulation for the heating zones,
    wherein the at least one set of trenches includes a first trench and a pair of second trenches, the first trench is sealed in the plate and extends between the top and bottom of the plate, the pair of second trenches extend inward from the bottom of the plate, and the first trench is disposed between the pair of second trenches.

2. The wafer susceptor as claimed in claim 1, wherein the at least one set of trenches includes at least one trench extending inward from the bottom of the plate.

3. The wafer susceptor as claimed in claim 1, wherein the at least one set of trenches includes a trench sealed in the plate and extending between the top and bottom of the plate.

4. The wafer susceptor as claimed in claim 1, wherein the plate further comprising: an electrode distributed between the top and the at least one set of trenches of the plate.

5. A method for manufacturing a wafer susceptor, comprising:
    preparing plural layers;
    performing a stamping process to a part of the layers to form at least one slit pattern on each of the part of the layers;
    performing a metallization process to form at least one metal pattern onto each of the part of the layers; and
    performing a stacking process to stack the layers in a predetermined order to form a plate of the wafer susceptor, wherein the slit patterns of the part of layers correspond to each other to thereby form at least one set of trenches in the plate, wherein the at least one set of trenches includes a first trench and a pair of second trenches, the first trench is sealed in the plate and extends between the top and bottom of the plate, the pair of second trenches extend inward from the bottom of the plate, and the first trench is disposed between the pair of second trenches.

6. The method as claimed in claim 5, wherein the at least one slit patter is an arc-shaped pattern defined by a slit.

7. The method as claimed in claim 5, wherein, in the stamping process, each of a first part of the layers has three slit patterns formed thereon, and each of a second part of the layers has two slit patterns formed thereon.

* * * * *